United States Patent [19]

Fujikawa et al.

[11] Patent Number: 4,576,897

[45] Date of Patent: Mar. 18, 1986

[54] PROCESS OF MAKING A POLYAMIDE PRINTING PLATE HAVING AN IMPROVED CONTACT WITH AN IMAGE-BEARING FILM

[75] Inventors: Junichi Fujikawa, Kyoto; Osamu Togashi, Ohtsu; Shigetra Kashio, Shiga, all of Japan

[73] Assignee: Toray Industries, Incorporated, Tokyo, Japan

[21] Appl. No.: 684,972

[22] Filed: Dec. 21, 1984

Related U.S. Application Data

[63] Continuation of Ser. No. 545,113, Oct. 25, 1983, abandoned, which is a continuation of Ser. No. 288,324, Jul. 30, 1981, abandoned.

[30] Foreign Application Priority Data

Aug. 7, 1980 [JP] Japan ................. 55-108630

[51] Int. Cl.$^4$ ................................. G03C 1/76
[52] U.S. Cl. ..................... 430/273; 430/281; 430/283; 430/300; 430/302; 430/950; 430/906
[58] Field of Search .............. 430/300, 302, 270, 271, 430/273, 283, 281, 950, 961, 906

[56] References Cited

U.S. PATENT DOCUMENTS

| | | | |
|---|---|---|---|
| 3,458,311 | 7/1969 | Alles | 430/281 |
| 3,891,443 | 6/1975 | Halpern et al. | 430/259 |
| 4,238,560 | 12/1980 | Nakamura et al. | 430/273 |
| 4,238,561 | 12/1980 | Grossa et al. | 430/271 |
| 4,268,611 | 5/1981 | Okishi et al. | 430/273 |
| 4,323,637 | 4/1982 | Gwendyline et al. | 430/273 |

FOREIGN PATENT DOCUMENTS 1464941 2/1977 United Kingdom .

Primary Examiner—Jack P. Brammer
Attorney, Agent, or Firm—Scully, Scott, Murphy & Presser

[57] ABSTRACT

The contact of an image-bearing film to the surface of a photosensitive polyamide printing plate is improved by forming an anti-stickiness layer on the photosensitive polyamide layer, the anti-stickiness layer comprising a polymer which is soluble or dispersible in a developer for the photosensitive polyamide, and having a thickness of 0.2 to 20$\mu$ and having a matted surface.

6 Claims, No Drawings

PROCESS OF MAKING A POLYAMIDE PRINTING PLATE HAVING AN IMPROVED CONTACT WITH AN IMAGE-BEARING FILM

This is a continuation of co-pending application Ser. No. 545,113 filed Oct. 25, 1983, abandoned which, in turn, is a continuation of application Ser. No. 288,324, filed July 30, 1981, now abandoned.

BACKGROUND OF THE INVENTION

This invention relates to a photosensitive polyamide printing plate superior in contact to a negative or positive image-bearing film.

In photosensitive printing plates in may cases, a photosensitive polymer layer and an image-bearing film (negative or positive) are brought into close contact with each other, and in this state there is performed an exposure with an active light ray. In many cases, however, the surface of the photosensitive polymer layer has a stickiness, so that its uniform contact to the image-bearing film is impeded and it becomes impossible to make uniform printing of images. Particularly, a photosensitive polyamide layer comprising a polyamide as the main component, a photopolymerizable monomer, a plasticizer, a photosensitizer and a heat stabilizer, often has a sticky surface. This is ascribable to the circumstances that polyamides generally have a high equilibrium moisture content so become sticky easily, that there is contained a large amount of a photopolymerizable monomer which is in many cases liquid for attaining a high image reproducibility and that a liquid plasticizer is often incorporated to impart flexibility.

Various methods have been adopted to solve the abovementioned problem. According to the most generally adopted method, a very small amount of a powder is applied uniformly onto the surface of a photosensitive polymer layer whereby it is intended to remove the stickiness of the surface of the same layer and at the same time improve the air escape when an image-bearing film is brought into close contact in vacuum. But this method involves a drawback such that a fairly high degree of skill is required to apply a powder onto the surface of the photosensitive layer uniformly and in a very small amount. If the powder is applied nonuniformly, the uniform contact of the image-bearing film is impeded. And if the powder is applied in an excess amount, there is created a distance between the image-bearing film and the photosensitive layer, so that an active light ray will be scattered and a sharp image is no longer obtainable. Particularly in the case of a very sticky photosensitive printing plate such as a photosensitive polyamide printing plate, it is extremely difficult to a powder uniformly and in a very small amount.

According to another method, a matted film is used as the image-bearing film. In this case, the matted film is more expensive and is more difficult to manufacture than ordinary films. Moreover, in case the stickiness of a photosensitive layer is very high, a mere matting of the image-bearing film is in many cases unsatisfactory in point of the effect of improvement of contact. Additionally, if an image-bearing film is matted to an excessive degree in an effort to improve its contact, an active light ray will be scattered on the matted film surface and the resulting bad influence will become no longer negligible.

As a method of improving the contact between an image-bearing film and a photosensitive polymer layer there has been proposed a method wherein the mat surface of a matted film is brought into pressure contact with the photosensitive polymer layer thereby matting the surface of the same layer (see British Pat. No. 1,464,941). This proposed method is superior in that the operation is not difficult unlike the operation of powder application and in that ordinary films are employable. However, in case the surface of a photosensitive polyamide layer has a strong stickiness, a mere matting of the surface of the same layer is not effective enough to prevent such a stickiness. And if the matting degree is made excessively strong in an effort to improve the contact between a very sticky photosensitive layer and the image-bearing film, there comes into problem the bad influence based on the scattering of an active light ray on the surface of the photosensitive layer. Moreover, in case the surface of a photosensitive layer is remarkably sticky, the separation of the matted film itself becomes difficult and consequently it becomes necessary to apply a releasing agent such as silicone onto the mat surface (see U.S. Pat. No. 3,891,443).

SUMMARY OF THE INVENTION

It is an object of this invention to overcome the foregoing disadvantages.

It is another object of this invention to provide a polyamide printing plate having an improved contact with an image-bearing film.

Other objects and advantages of this invention will become apparent from the following description.

The above objects of this invention can be attained by forming an anti-stickiness layer on a photosensitive polyamide layer, the anti-stickiness layer comprising a polymer which is soluble or dispersible in a developer for the photosensitive polymer and having a thickness of 0.2 to 20μ and further having a matted surface.

By the provision of such an anti-stickiness layer having a matted surface according to this invention, the following points can be improved as compared with conventional methods.

(1) The operation is not difficult unlike the method wherein powder is applied.
(2) Ordinary films are employable without the necessity of using a matted film as the image-bearing film.
(3) Even where the stickiness of a photosensitive polymer layer itself is remarkable, such stickiness can be prevented to a satisfactory extent since the anti-stickiness layer does not contain any component which would cause stickiness such as a photopolymerizable monomer or a plasticizer. Besides, since the surface of the anti-stickiness layer itself is matted, there is attained an extremely good contact of the image-bearing film.
(4) Since the stickiness of the surface of the anti-stickiness layer is at an extremely low level, it is easy to separate a matted cover film.

The photosensitive polyamide to which this invention is applied is obtainable by using as the main resin component a polyamide which is soluble or dispersible in an organic solvent or water and incorporating therein a monomer having one or more photopolymerizable unsaturated bonds in the molecule, a plasticizer, a photosensitizer and a heat stabilizer.

The polyamides which may be used as the main resin component of the photosensitive layer are linear polyamides prepared in known manner from dibasic acids and diamines and from ω-amino acids, lactams, or derivatives thereof. Not only homopolymers but also copolymers and block polymers are employable if they are soluble or dispersible in an organic solvent or water. Also employable are those having a substituent group on a carbon or nitrogen atom which constitutes the main chain. Typical examples are homopolyamides such as nylon 3, 4, 5, 6, 8, 11, 12, 13, 6.6, 6.10, 6.13, a polyamide from metaxylylenediamine and adipic acid, and a polyamide from trimethyl hexamethylenediamine or isophoronediamine and adipic acid; copolyamides such as nylon 6/6.6, 6/6.6/6.10, 6/6.6/6.10/6.12, ε-caprolactam/adipic acid/hexamethylenediamine/4,4-diaminodicyclohexylmethane, and ε-caprolactam/adipic acid/hexamethylenediamine/polyethylene glycol diamine; as well as N-methylol and N-alkoxymethyl derivatives of the above polyamides, a copolymer of N,N'-di(γ-aminopropyl)piperazine adipate/ε-caprolactam and other polyamides having a basic tertiary nitrogen alone or in combination with a quaternarizing agent for forming ammonium ions such as acrylic acid. Furthermore, there also may be used polyamides wherein a double bond has been introduced to the amino or carboxyl terminus by reacting the above polyamides with unsaturated compounds having an epoxy group such as glycidyl methacrylate. There polyamides may be used alone or as a mixture of two or more.

Photopolymerizable monomers to be incorporated in the above polyamides are those having a photopolymerizable unsaturated bond and being compatible with the polyamide as the main resin component. As the plasticizer there may be used glycols such as ethylene glycol and sulfonamides such as N-ethyltoluenesulfonamide. As the photosensitizer there may be used all of known ones, typical of which are benzoins, benzoin alkylethers, benzophenones and benzils. As the heat stabilizer there may be used all of known ones such as hydroquinone, hydroquinone monomethyl ether and t-butylcatechol.

As the anti-stickiness layer to be formed on the photosensitive polyamide layer there may be used any one if only it is soluble or dispersible in a developer for the polyamide printing plate, typical of which are as follows, but the following do not constitute a limitation.

That is, polyamides employable as the main component of the photosensitive layer, polyvinyl acetate as an alcohol-soluble polymer alcohol-soluble acrylic copolymers, alcohol-soluble polyurethanes, and in case the photosensitive layer is water-developable, polyvinyl alcohol, partially saponified polyvinyl acetate, gelatin, cellulose derivatives and polyethylene oxide. These may be used as a mixture of two or more.

The anti-stickiness layer may be comprises two layers of an upper layer and a lower layer. The upper layer preferably comprises a partially saponified polyvinyl acetate having a saponification degree in the range of from 60 to 90 mole%, and the lower layer preferably comprises a water-developable polyamide and a partially saponified polyvinyl acetate having a saponification degree not higher than 90 mole%.

Various methods are employable for forming the anti-stickiness layer on the surface of the photosensitive polyamide layer. For example, there may be adopted a method of applying a polymer solution for the anti-stickiness layer onto the surface of the photosensitive layer by means of a gravure coater, a roll coater, a curtain flow coater or a spray coater, followed by drying. In this case, as a solvent of the polymer solution there must be used a bad solvent for the photopolymerizable monomer and the plasticizer so that the photopolymerizable monomer and the plasticizer may not be transferred from the photosensitive layer onto the surface of the anti-stickiness layer and so that the latter layer may not thereby become very sticky. It is also possible to extrude from a slit die a polymer for the anti-stickiness layer in a molten state or in a fluidized state by moistening one containing a small amount of a solvent to form a film on the photosensitive layer. The simplest method consists in applying a polymer solution for the anti-stickiness layer onto a plastic film or sheet followed by drying to form a coating on the film or sheet, then bringing this coating surface into pressure contact with the photosensitive layer and separating this film or sheet thereby transferring the anti-stickiness coating onto the photosensitive layer.

It is necessary that the thickness of the anti-stickiness layer be in the range of from 0.2 to 20μ. If its thickness exceeds 20μ, the distance between the image-bearing film and the photosensitive layer increases, so that an active light ray is scattered and bad influences such as deterioration in image sharpness become no longer negligible. Therefore, the upper limit of the thickness of the anti-stickiness layer is 20μ. If the anti-stickiness layer becomes too thin, the surface of the anti-stickiness layer is sometimes influenced by the photosensitive layer to the extent that the anti-stickiness effect becomes unsatisfactory. But if there is made proper selection of a polymer for the anti-stickiness layer and of its forming method on the photosensitive layer, even a small thickness of 0.2μ or so can fully display the effect. Therefore, the lower limit of the thickness of the anti-stickiness layer is 0.2μ.

The surface of the anti-stickiness layer may be matted by contacting under pressure the mat surface of a sand-dressed aluminum plate, a zinc phosphate treated steel plate, an emboss roll, or a matted film with a smooth surface of the anti-stickiness layer. But the simplest method consists in applying a polymer for the anti-stickiness layer in advance onto the mat surface of a matted film to form a coating and then bringing it into pressure contact with the photosensitive layer thereby transferring the anti-stickiness coating onto the photosensitive layer by utilization of the stickiness of the latter layer. According to this simplest method, once the matted film is separated, the surface of the anti-stickiness layer is a replica of the mat surface of the film. In this way, the anti-stickiness layer having a mat surface can be easily formed on the photosensitive layer. As the material of a matted film used for such a purpose, a polyester film is best suited in point of dimensional stability and oxygen barrier properties, but there also may be used polypropylene film, polyethylene film, polyvinyl chloride film, polystyrene film, cellophane, and polyvinyl alcohol film. As the method of matting the film surface there may be used chemical etching, sandblasting, an emboss mat, a coating mat for applying a polymer containing a matting agent, and a direct mat by the addition of a matting agent. Furthermore, the mat shape may be modified by applying and curing an epoxy resin onto the mat surface.

A suitable mat shape is influenced by the thickness of the anti-stickiness layer and by the properties of the polymer used. However, if an average depth of the mat is below 0.1μ, the prevention of the surface stickiness becomes less effective and the function as an air escape passage at the time of vacuum contact of the image-bearing film is no longer performed. Therefore, it is necessary that an average depth of the mat be not less than 0.1μ. As the depth of the mat becomes larger, the anti-stickiness effect and the air escape at the time of vacuum contact are so much improved, but at the same time there appears a bad influence against images caused by the scattering or diffusion of an active light ray on the surface of the anti-stickiness layer. The limit of preventing such a bad influence from being revealed is about 10μ in terms of an average depth of the mat. Therefore, it is necessary that the average depth of the mat be kept not more than 10μ. Thus, the average depth of the mat is required to be in the range of from 0.1 to 10μ, preferably from 0.3 to 5μ.

An insufficient contact between the anti-stickiness layer and the photosensitive polyamide layer may cause floating or separation of the anti-stickiness layer from the photosensitive layer during handling of the printing plate. To solve this problem, it is effective to adopt a two-layer structure for the anti-stickiness layer wherein the lower layer in contact with the photosensitive layer is formed of a mixture consisting mainly of a polyamide employable as the main resin component of the photosensitive layer and a polymer of the same kind as the polymer of the anti-stickiness layer, and the upper layer is formed of an anti-stickiness polymer. Since the said lower layer is not a photosensitive layer, the thickness of the anti-stickiness layer must be in the range of from 0.2 to 20μ in total even in the case of such a two-layer structure. The polyamide in the lower layer mixture need not be the same as the polyamide in the photosensitive layer, and the polymer of the same kind as the polymer of the anti-stickiness layer need not be identical with the latter. And the lower layer as a mixture must be soluble or dispersible in a developer for the photosensitive layer.

The reason why the anti-stickiness layer having a mat surface in this invention exhibits a very outstanding effect in improving the contact of an image-bearing film to the photosensitive polyamide layer is presumed to be as follows. By the provision of the anti-stickiness layer consisting of polymers alone not containing a photopolymerizable monomer or a plasticizer, it is made possible to prevent the stickiness of the photosensitive layer, and further by imparting a mat shape thereto there is exerted a synergistic effect sufficient to remove the stickiness thereby improving the air escape at the time of vacuum contact of the image-bearing film. By the adoption of this method there is obtained a good contact of the image-bearing film even in the case of a printing plate wherein the stickiness of the photosensitive layer is too strong and so the method such as matting for the surface of the photosensitive layer cannot permit a uniform printing. Moreover, since the surface of the anti-stickiness layer is less sticky, it is possible to separate a cover film easily even without applying a releasing agent thereto. Furthermore, the anti-stickiness layer consists mainly of a polymer which is soluble or dispersible in a developer for the photosensitive layer and it is substantially non-photosensitive, therefore it can be removed at the time of development. As a result, the anti-stickiness layer which is not photo-set remains on an image, whereby drawbacks such as an easy flawing, wear and deterioration of the ink transferring property of the printing plate surface are no longer recognized at all.

As set forth hereinbefore, the method of this invention is a superior method capable of having an image-bearing film contacted sufficiently to a photosensitive polyamide printing plate without having any bad influence upon the performance of the printing plate.

Working examples of this invention will be described hereinunder to illustrate the invention more concretely.

EXAMPLE 1

As a resin for the anti-stickiness layer there was chosen "ULTRAMIDE-1C" (BASF product), an alcohol-soluble polyamide, and this polyamide was dissolved in ethanol at a concentration of 10% (by weight). The resulting solution was applied with a gravure coater onto the mat surface of a 100μ thick polyester film which had been matted by chemical etching, and then dried at 120° C. for 30 seconds to give a polyester film having a 1μ thick coating of "ULTRAMIDE-1C".

The film thus obtained as a cover film was brought into pressure contact with the surface of a photosensitive polyamide printing plate having a thickness of 950μ by means of a roll heated at 80° C. so that the "ULTRAMIDE-1C" coating was in contact with the photosensitive layer, the photosensitive polyamide printing plate comprising "ULTRAMIDE-1C" as a resin component, a methacrylate type unsaturated polyfunctional vinyl monomer as a photopolymerizable component, N-ethyltoluenesulfonamide as a plasticizer and benzophenone as a photosensitizer. By way of comparison, a polyester film which had been matted by the same chemical etching was brought into pressure contact with the same polyamide printing plate directly at 80° C.

When the cover films were separated from both printing plates, there were observed the same mat surfaces. However, when an exposure was made using a halftone negative film and with a mercury vapor lamp, there occurred a spoiling of image fidelity based on insufficient contact of the negative film on the printing plate wherein the photosensitive layer surface itself was matted. On the other hand, in the printing plate which had been subjected to the anti-stickiness treatment with the "ULTRAMIDE-1C" having a matted surface, there was recognized no stickiness of the printing plate surface and it was confirmed that there occurred no spoiling of image fidelity even for the same negative film.

The sample having the anti-stickiness layer of "ULTRAMIDE-1C" was developed by a brush type developing machine containing ethanol and water at a ratio of 80:20 (weight ratio), to give an exact reproduction of the negative film, which proved to be free from thickening of dots. Furthermore, the surface of the printing plate was checked before and after the development; as a result, it was confirmed that the anti-stickiness layer had been removed during the development. When a printing test was made using this printing plate, there was no bad influence caused by the anti-stickiness layer.

EXAMPLE 2

As an anti-stickiness resin there was chosen "AMILAN" CM-4000 (a product of Toray Ind. Inc.), an alcohol-soluble polyamide, and this polyamide was dissolved in a mixed solvent of ethanol/water=90/10 (weight ratio) at its concentration of 15% (by weight). The resulting solution was applied with a natural roll coater onto the mat surface of a 85μ thick polyester film which had been matted by sandblasting, and then dried at 140° C. for 20 seconds to form a 4μ thick coating.

There was chosen a photosensitive polyamide printing plate comprising N-methoxymethylated 6-nylon as the main resin component, an acrylic vinyl monomer as a photopolymerizable component, diethylene glycol as a plasticizer, benzoin methyl ether as a photosensitizer and hydroquinone as a heat stabilizer. Its thickness was 450μ, including a base film of polyester (200μ).

After applying a very small amount of ethanol onto the surface of the photosensitive printing plate, the cover film having the "AMILAN" CM-4000 coating previously obtained was brought into pressure contact at 40° C. with the surface of the photosensitive layer. By way of comparison, a polyester film which had been subjected to the same sandblasting was also brought into pressure contact under the same conditions so that its mat surface was in contact with the photosensitive layer.

From the printing plates thus having the cover films there were separated the same films. In this separating operation, the cover film having the "AMILAN" CM-4000 coating could be separated easily, while the one with its sandmatted surface contacted directly required a peeling force of more than 100 g/cm and thus its separation was very difficult. When these samples were exposed to light through a practical negative film, the printing plate wherein the surface of the photosensitive layer itself was matted was unable to attain a uniform contact of the negative film, while the printing plate wherein the "AMILAN" CM-4000 coating having a matted surface was formed on the photosensitive layer exhibited no stickiness on its surface and it permitted a uniform vacuum contact of the negative film easily.

The exposed printing plates were developed by means of a spray type washing-out machine (pressure 3 kg/cm²) containing ethanol; as a result, the printing plate wherein the surface of the photosensitive layer itself was matted exhibited a partially thickened printing area because of nonuniform contact of the negative film and thus its practical use as a printing plate was impossible. On the other hand, the printing plate having the "AMILAN" CM-4000 coating for the prevention of stickiness showed an exact reproduction of the negative film and the image proved to be sharp. By observing the printing plate surface through a microscope it was confirmed that the "AMILAN" CM-4000 coating had been removed during the development. As a result of a printing test, the printing plate having the anti-stickiness coating afforded a good printed matter without deterioration of the ink transferring property.

EXAMPLE 3

As a polymer for the anti-stickiness layer there was chosen a partially saponified polyvinyl acetate having a saponification degree of about 90 mole% and a polymerization degree of about 500, and it was dissolved in a mixed solvent of methanol/water=50/50 (weight ratio) at its concentration of 5% (by weight) to prepare a solution.

The solution was applied onto a polyester film (50μ thick) which had been matted directly by the addition of a matting agent, by means of a curtain flow coater so as to give a thickness of 7μ in terms of a dried coating thickness.

As a photosensitive polyamide printing plate there was chosen a printing plate with a 700μ thick polyester base film containing as the main resin component a copolyamide of N,N'-di(γ-aminopropyl)piperazine adipate/ε-caprolactam which had been quaternarized by the addition of acrylic acid, further containing an acrylate type polyfunctional vinyl monomer and benzoin ethyl ether as a sensitizer. The surface of this printing plate was so sticky that it was fairly difficult to apply a powder uniformly in a very small amount.

Onto the surface of this photosensitive layer, after applying thereto a small amount of ethanol, the foregoing matted film coated with the partially saponified polyvinyl acetate was brought into pressure contact by means of a roll heated at 50° C. so that its coating surface was in contact with the photosensitive layer.

In exposing the printing plate thus having the cover film, the same film was separated, which could be easily peeled leaving on the printing plate surface the matted coating surface of the partially saponified polyvinyl acetate, so that there was recognized no stickiness and a uniform contact of the image-bearing film could be attained very easily.

The printing after exposure was developed by means of a spray type washing-out machine (pressure 3 kg/cm²) containing water. The image thereby obtained proved to be very sharp involving no problem. Moreover, through observation of the printing plate it was confirmed that the anti-stickiness layer had been completely dissolved out into water during the development.

EXAMPLE 4

Acryl-melamine resin containing a matting agent was applied onto a 100μ thick polyester film and then dried and cured to obtain a matted coating film, onto which was applied a 15% (by weight) solution of a partially saponified polyvinyl acetate having a saponification degree of 78–82 mole% and a polymerization degree of 500 in a mixed solvent of methanol/water=60/40 (weight ratio), followed by drying at 120° C. for 1 minute to form a 2μ thick coating. Onto the coating thus obtained there was applied a 10% (by weight) solution of 90 parts of a copolyamide of caprolactam/adipic acid/hexamethylenediamine/polyethylene glycol diamine and 10 parts of a partially saponified polyvinyl acetate having a saponification degree of 40 mole% in a mixed solvent of methanol/water=60/40 (weight ratio), followed by drying at 120° C. for 30 minutes. The total thickness of the first and second layers was 3.5μ.

As a photosensitive polymer layer there was used one comprising the same polyamide as the second layer as the main resin component after reaction with a small amount of glycidyl methacrylate to introduce a double bond, an acrylate type vinyl monomer as a photopolymerizable component and dimethyl benzyl ketal as a photosensitizer. The thickness of this printing plate, including a steel base, was 580μ. The surface of the photosensitive layer was very sticky.

Onto the surface of this photosensitive polymer layer, after applying thereto a small amount of ethanol, the previously-formed matted film having a two-layer coating was brought into pressure contact at room temperature.

From the printing plate with a cover film thus obtained there could be easily separated the cover film leaving on the printing plate surface the coating of the partially saponified polyvinyl acetate having a saponification degree of 78–82 mole% and a polymerization degree of 500, and thus the coating mat surface was transferred. The stickiness which had been observed on the surface of the photosensitive layer was not recognized at all; as a result, the negative film could contact to the same layer easily and uniformly, and the exposure could be effected without spoiling image fidelity.

The printing plate after exposure was developed by means of a brush type washing-out machine containing water. The image thereby formed was very sharp, and it was confirmed that the first and second layers as anti-stickiness layers both had been removed during the development.

EXAMPLE 5

As a first layer composition, 40 parts by weight of "Gosenol" KP-06, a polyvinyl alcohol having a saponification degree of 71–75 mole%, (a product of Nippon Gosei Kagaku Ltd.), and as a water-dispersible polyamide 60 parts by weight of a copolymer nylon of ε-caprolactam/adipic acid/hexamethylenediamine/polyethylene glycol diamine=30/35/15/20 (weight ratio), were dissolved in a mixed solvent of water/ethanol=50/50 (weight ratio) at 80° C. so that their concentration was 15% (by weight), to prepare a stock solution.

As a second layer composition, "Gosenol" KH-20, a polyvinyl alcohol having a saponification degree of 78–82 mole%, was dissolved in a mixed solvent of water/ethanol=40/60 (weight ratio) at 80° C. so that its concentration was 10% (by weight) to prepare a stock solution.

As a cover film there was chosen a sandmatted polyester film (75μ thick), and onto the mat surface of this film there was applied the stock solution for the second layer by means of a gravure coater so as to give a coating thickness of 1μ in terms of a dried coating thickness, followed by drying at 120° C. for 30 seconds. Thus, there was applied to a two-layer coating on the matted polyester film with the second layer formed on the film side and the first layer thereon.

As a water-developable, photosensitive polyamide printing plate there was chosen as 1 mm thick printing plate formed of the same polyamide as that used in the first layer as a resin component, propylene glycol diglycidyl ether dimethacrylate as a crosslinking agent and dimethyl benzyl ketal as a sensitizer. The surface of this printing plate was so sticky that the contact of a negative film was very difficult. The cover film having a two-layer structure obtained by the foregoing coating operation was brought into pressure contact with the photosensitive polymer layer while applying heat at 80° C. so that the coating surface was in contact with the photosensitive layer. By way of comparison, only the stock solution of polyvinyl alcohol alone of the second layer was applied to the same film under the same conditions to prepare a cover film having a single-layer coating, which was also brought into pressure contact with the photosensitive layer while applying heat.

The cover films were separated from the photosensitive printing plates thus obtained. In the case of the cover film coated with only the second layer stock solution, the polyvinyl alcohol floated up and came off the surface of the photosensitive layer. On the other hand, the cover film coated with two layers did not undergo such a phenomenon and it could be separated easily. And the coating layer on the film was completely transferred onto the photosensitive layer, and no stickiness was recognized on the surface of the photosensitive layer.

A negative film was put on and closely contacted in vacuum with the printing plate having an anti-stickiness layer of the two-layer structure; as a result, it proved to contact without any trouble. Also during the exposure operation, there was observed no elimination of the anti-stickiness layer.

The printing plate after exposure was developed by means of a brush type washing-out machine containing water. The printing plate surface after development was observed through a microscope to find that the anti-stickiness layer did not remain at all thereon. As a result of evaluation of the relief image thereby obtained, it was confirmed that the provision of the anti-stickiness layer did not affect at all the sharpness of the image and that the depth of the white area was not reduced at all. Also in a printing test, there was recognized no bad influence by the provision of the anti-stickiness layer, and a good printed matter was obtained.

EXAMPLE 6

As a first layer composition, 20 parts by weight of polyvinyl alcohol having a saponification degree of about 40 mole% and 80 parts by weight of the same water-dispersible polyamide as that used in Example 1 were dissolved in a mixed solvent of water/ethanol=40/60 (weight ratio) so that their concentration was 15% (by weight), to prepare a stock solution.

As a second layer composition, "Gosenol" KL-05, a polyvinyl alcohol having a saponification degree of 78–82 mole%, (a product of Nippon Gosei Kagaku Ltd.), was dissolved in a mixed solvent of water/ethanol=60/40 (weight ratio) at its concentration degree of 91–94 mole% was dissolved under the same conditions also as a second layer composition.

As a cover film there was chosen a chemically matted polyester film (100μ thick), to which there was applied a two-layer coating in the same manner as in Example 5. The thickness of the second layer and that of the first layer were each 1.5μ, so that the total thickness was 3μ.

The cover film was brought into pressure contact under heating at 80° C. with the same water-developable, photosensitive polyamide printing plate as that used in Example 5. In this printing plate there occurred neither the foregoing elimination of the cover film nor the elimination of the anti-stickiness layer during exposure. The vacuum contact of a negative film was easy, and it was confirmed that there occurred no spoiling of image fidelity.

The exposed printing plate was washed out by means of a brush type developing machine containing water. The printing plate surface was observed through a microscope to find that there remained no anti-stickiness layer. An evaluation was made about the image thereby obtained; as a result, in the case of the printing plate using as the second layer "Gosenol" AL-06 having a saponification degree of 91–94 mole%, the sharpness of image was deteriorated and fine lines 200μ wide were reproduced as 240μ wide lines, and further the white area proved to be fairly shallow. On the other hand, in the case of the printing plate using KL-05 having a saponification degree of 78–82 mole%, the image was sharp and was an exact reproduction of the negative and the depth of the white area was not reduced at all. From these results it became clear that the use of polyvinyl alcohol having a saponification degree of above 90 mole% would result in a worse influence caused by the scattering of an active light ray.

What is claimed is:

1. A process of preparing a polyamide printing plate having an improved contact with an image-bearing film, which comprises providing a base layer, applying thereto a photosensitive polyamide layer comprising alcohol-soluble or water-soluble polyamide and ethylenically unsaturated compound, applying an anti-stickiness layer comprising a polymer which is soluble or dispersible in a developer for said photosensitive polyamide, said anti-stickiness layer having a thickness in the range of from 0.2 to 20μ and having a matted surface which is formed by applying a polymer for the anti-stickiness layer in advance onto the mat surface of a matted film to form a coating and then bringing it into pressure contact with the photosensitive layer thereby transferring the anti-stickness coating onto the photosensitive layer, and then removing the matted film from the antistickiness coating which has been transferred to the photosensitive layer.

2. The process of claim 1, in which said photosensitive polyamide is an alcohol-developable photosensitive polyamide composition.

3. The process of claim 1, in which said anti-stickiness layer comprises an alcohol-soluble polyamide.

4. The process of claim 1, in which said photosensitive polyamide is a water-developable photosensitive polyamide composition.

5. The process of claim 4, in which said polyamide is a polyamide-ether containing ether segments.

6. The process of claim 1 or claim 5, in which said anti-stickiness layer comprises an upper layer and a lower layer, said upper layer comprising a partially saponified polyvinyl acetate having a saponification degree in the range of from 60 to 90 mole%, and said lower layer comprising a water-developable polyamide and a partially saponified polyvinyl acetate having a saponification degree not higher than 90 mole%, with a total thickness of said upper and lower layers being in the range of from 0.2 to 20μ.

* * * * *